(12) United States Patent
Yadav et al.

(10) Patent No.: US 11,307,604 B2
(45) Date of Patent: Apr. 19, 2022

(54) CLAMP CIRCUIT

(71) Applicant: QUALCOMM Incorporated, San Diego, CA (US)

(72) Inventors: Kshitij Yadav, San Diego, CA (US); Sherif Galal, Irvine, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/143,382

(22) Filed: Jan. 7, 2021

(65) Prior Publication Data
US 2021/0232169 A1 Jul. 29, 2021

Related U.S. Application Data

(60) Provisional application No. 62/966,479, filed on Jan. 27, 2020.

(51) Int. Cl.
*G05F 3/26* (2006.01)
*H02H 9/04* (2006.01)
*H03M 1/12* (2006.01)

(52) U.S. Cl.
CPC ............. *G05F 3/262* (2013.01); *H02H 9/04* (2013.01); *H03M 1/12* (2013.01)

(58) Field of Classification Search
CPC ............. G05F 3/262; H02H 9/04; H03M 1/12

USPC ........................................................ 327/543
See application file for complete search history.

(56) References Cited

U.S. PATENT DOCUMENTS

| | | | |
|---|---|---|---|
| 10,090,826 B1* | 10/2018 | Wessendorf | H03F 3/45636 |
| 2012/0007649 A1* | 1/2012 | Rankin | G05F 3/265 |
| | | | 327/328 |
| 2014/0103900 A1* | 4/2014 | Lahiri | G05F 3/24 |
| | | | 323/313 |
| 2015/0235711 A1* | 8/2015 | Zhou | G11C 11/5642 |
| | | | 365/185.21 |

* cited by examiner

*Primary Examiner* — Tomi Skibinski
(74) *Attorney, Agent, or Firm* — Loza & Loza LLP

(57) ABSTRACT

In certain aspects, a clamp circuit includes a first current mirror having a first branch and a second branch, wherein the first current mirror is configured to mirror a current flowing through the first branch of the first current mirror to the second branch of the first current mirror. The clamp circuit also includes a second current mirror having a first branch and a second branch, wherein the second current mirror is configured to mirror a current flowing through the first branch of the second current mirror to the second branch of the second current mirror. The first branch of the first current mirror is coupled in series with the second branch of the second current mirror, and the second branch of the first current mirror is coupled in series with the first branch of the second current mirror.

30 Claims, 11 Drawing Sheets

CLAMP CIRCUIT

RELATED APPLICATION

This application claims priority under 35 U.S.C. § 119(e) to U.S. Provisional Application No. 62/966,479 filed on Jan. 27, 2020, the entire specification of which is incorporated herein by reference.

BACKGROUND

Field

Aspects of the present disclosure relate generally to voltage protection, and more particularly to clamp circuits.

Background

A clamp circuit may be used to clamp the peak voltage on a conductive line. In one application, the clamp circuit may be used to prevent the voltage on the conductive from exceeding a voltage limit of a circuit coupled to the conductive line.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a clamp circuit. The clamp circuit includes a first current mirror having a first branch and a second branch, wherein the first current mirror is configured to mirror a current flowing through the first branch of the first current mirror to the second branch of the first current mirror. The clamp circuit also includes a second current mirror having a first branch and a second branch, wherein the second current mirror is configured to mirror a current flowing through the first branch of the second current mirror to the second branch of the second current mirror. The first branch of the first current mirror is coupled in series with the second branch of the second current mirror, and the second branch of the first current mirror is coupled in series with the first branch of the second current mirror.

A second aspect relates to a system. The system includes a reference circuit configured to generate a reference voltage, an analog-to-digital converter (ADC), a conductive line coupled between the reference circuit and the ADC, and a clamp circuit coupled to the conductive line. The clamp circuit includes a first current mirror having a first branch and a second branch, wherein the first current mirror is configured to mirror a current flowing through the first branch of the first current mirror to the second branch of the first current mirror. The clamp circuit also includes a second current mirror having a first branch and a second branch, wherein the second current mirror is configured to mirror a current flowing through the first branch of the second current mirror to the second branch of the second current mirror. The first branch of the first current mirror is coupled in series with the second branch of the second current mirror, and the second branch of the first current mirror is coupled in series with the first branch of the second current mirror.

A third aspect relates to a clamp circuit. The clamp circuit includes a first transistor having a drain, a gate, and a source, wherein the drain of the first transistor is coupled to the gate of the first transistor, and the source of the first transistor is coupled to a ground. The clamp circuit also includes a second transistor having a drain, a gate, and a source, wherein the gate of the second transistor is coupled to the gate of the first transistor, and the source of the second transistor is coupled to the ground. The clamp circuit also includes a third transistor having a drain, a gate, and a source, wherein the drain of the third transistor is coupled to the drain of the first transistor. The clamp circuit also includes a fourth transistor having a drain, a gate, and a source, wherein the drain of the fourth transistor is coupled to the drain of the second transistor and the gate of the fourth transistor, and the gate of the fourth transistor is coupled to the gate of the third transistor.

A fourth aspect relates to a method for clamping a voltage on a conductive line. The method includes coupling a first current mirror and a second current mirror into a feedback loop, and coupling the second current mirror to the conductive line.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the described implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

A clamp circuit may be used to clamp the peak voltage on a conductive line to a clamp voltage. In one application, the clamp circuit may be used to provide over-voltage protection for a circuit coupled to the conductive line. In this application, the clamp circuit protects the circuit by preventing the voltage on the conductive line from exceeding a voltage limit of the circuit.

When the voltage on the conductive line is below the clamp voltage of the clamp circuit, it may be desirable for the clamp circuit to have low leakage current (e.g., high impedance) to prevent the clamp circuit from affecting the normal operation of one or more circuits coupled to the conductive line and/or to reduce power leakage. When the voltage on the conductive line reaches the clamp voltage, the clamp circuit may provide a low-impedance path from the conductive line to ground to prevent the voltage on the conductive line from rising above the clamp voltage.

The conductive line may be implemented with one or more metal lines on a chip, one or more metal traces on a circuit board, or a combination of both. The conductive line may be used to carry a signal, a supply voltage, a reference voltage, etc.

One type of clamp circuit is a diode-based clamp circuit, which may include one or more diodes coupled in series (e.g., between the conductive line and ground). For the case where the diode-based clamp circuit includes one diode, the clamp voltage is approximately equal to the turn-on voltage of the diode. For the case where the diode-based clamp circuit includes multiple diodes coupled in series, the clamp voltage is approximately equal to the sum of the turn-on voltages of the diodes. A drawback of a diode-based clamp circuit is that the diode-based clamp circuit may have a relatively large leakage current when the voltage on the conductive line is below the clamp voltage. The large leakage current may negatively affect the normal operation of one or more circuits coupled to the conductive line. An example of this is discussed below.

Figure 1:
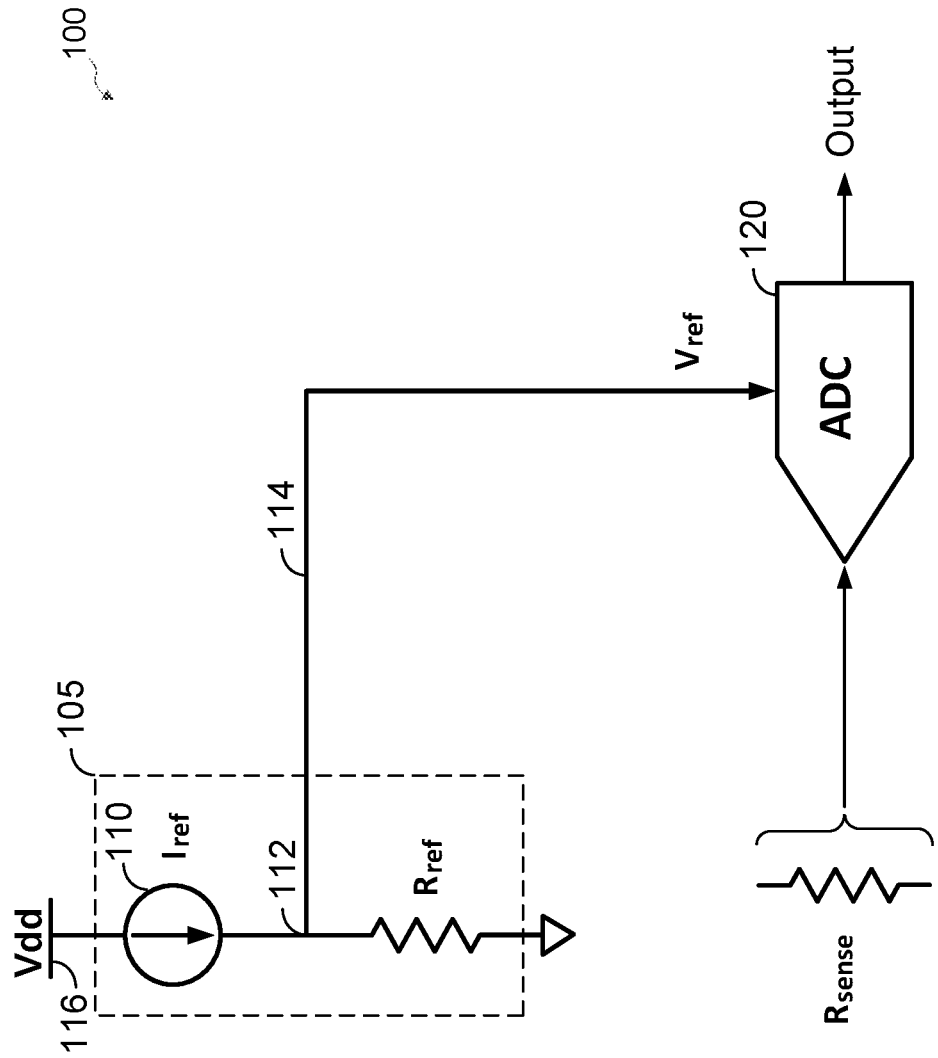
FIG. 1 shows an example of a system including a sense resistor, an analog-to-digital converter (ADC), and a reference circuit according to certain aspects of the present disclosure.

FIG. 1 shows an example of a system 100 including a sense resistor $R_{sense}$, an analog-to digital converter (ADC) 120, and a reference circuit 105. The sense resistor $R_{sense}$ is used to measure the current flowing through a device (not shown) coupled to the sense resistor $R_{sense}$. The device may include a speaker, a coil, or another type of device. The current flowing through the sense resistor $R_{sense}$ is measured by sensing the voltage across the sense resistor, in which the voltage is given by:

$$V_{sense} = I_{sense} \times R_{sense} \qquad (1)$$

where $V_{sense}$ is the voltage across the sense resistor, $I_{sense}$ is the current flowing through the sense resistor, and $R_{sense}$ in equation (1) is the resistance of the sense resistor $R_{sense}$. As shown in equation (1), the voltage across the sense resistor $R_{sense}$ is proportional to the current flowing through the sense resistor $R_{sense}$, and therefore provides a measurement of the current flowing through the sense resistor $R_{sense}$. The voltage across the sense resistor $R_{sense}$ is input to the ADC 120, which converts the voltage into a digital current measurement.

The resistance of the sense resistor $R_{sense}$ is dependent on the temperature of the sense resistor $R_{sense}$. As a result, the current measurement obtained from the sense resistor $R_{sense}$ varies with variations in the temperature of the sense resistor $R_{sense}$, which can negatively affect the accuracy of the current measurement. To address this, the reference circuit 105 generates a reference voltage $V_{ref}$ that tracks variations in the resistance of the sense resistor $R_{sense}$ with temperature. The reference voltage $V_{ref}$ is input to the ADC 120. Since the reference voltage $V_{ref}$ tracks variations in the resistance of the sense resistor $R_{sense}$ with temperature, the reference voltage $V_{ref}$ allows the ADC 120 to provide a consistent digital current measurement for a given current across temperature.

In the example in FIG. 1, the reference circuit 105 includes a temperature-compensated current source 110, and a reference resistor $R_{ref}$. The temperature-compensated current source 110 and the reference resistor $R_{ref}$ are coupled in series between a supply rail 116 and ground. The supply rail 116 provides a supply voltage of Vdd. The temperature-compensated current source 110 is configured to provide a reference current $I_{ref}$ that is approximately independent of temperature (i.e., does not change with temperature). The reference current $I_{ref}$ flows into the reference resistor $R_{ref}$ to generate the reference voltage $V_{ref}$ across the reference resistor $R_{ref}$. Thus, the reference voltage $V_{ref}$ is given by:

$$V_{ref} = I_{ref} \times R_{ref} \qquad (2)$$

where $R_{ref}$ in equation (2) is the resistance of the reference resistor $R_{ref}$. The reference resistor $R_{ref}$ may be made of the same or substantially the same material as the sense resistor $R_{sense}$ and may be placed close to the sense resistor $R_{sense}$ such that the resistance of the reference resistor $R_{ref}$ tracks variations in the resistance of the $R_{sense}$ with temperature. Since the resistance of the reference resistor $R_{ref}$ tracks variations in the resistance of the sense resistor $R_{sense}$ with temperature, the reference voltage $V_{ref}$, which is proportional to the resistance of the reference resistor $R_{ref}$, also tracks variations in the resistance of the sense resistor $R_{sense}$ with temperature.

The reference circuit 105 is coupled to the ADC 120 via a conductive line 114 (e.g., metal line). In the example in FIG. 1, the conductive line 114 is coupled between node 112 of the reference circuit 105 and the ADC 120, in which node 112 is between the temperature-compensated current source 110 and the reference resistor $R_{ref}$.

Figure 2:
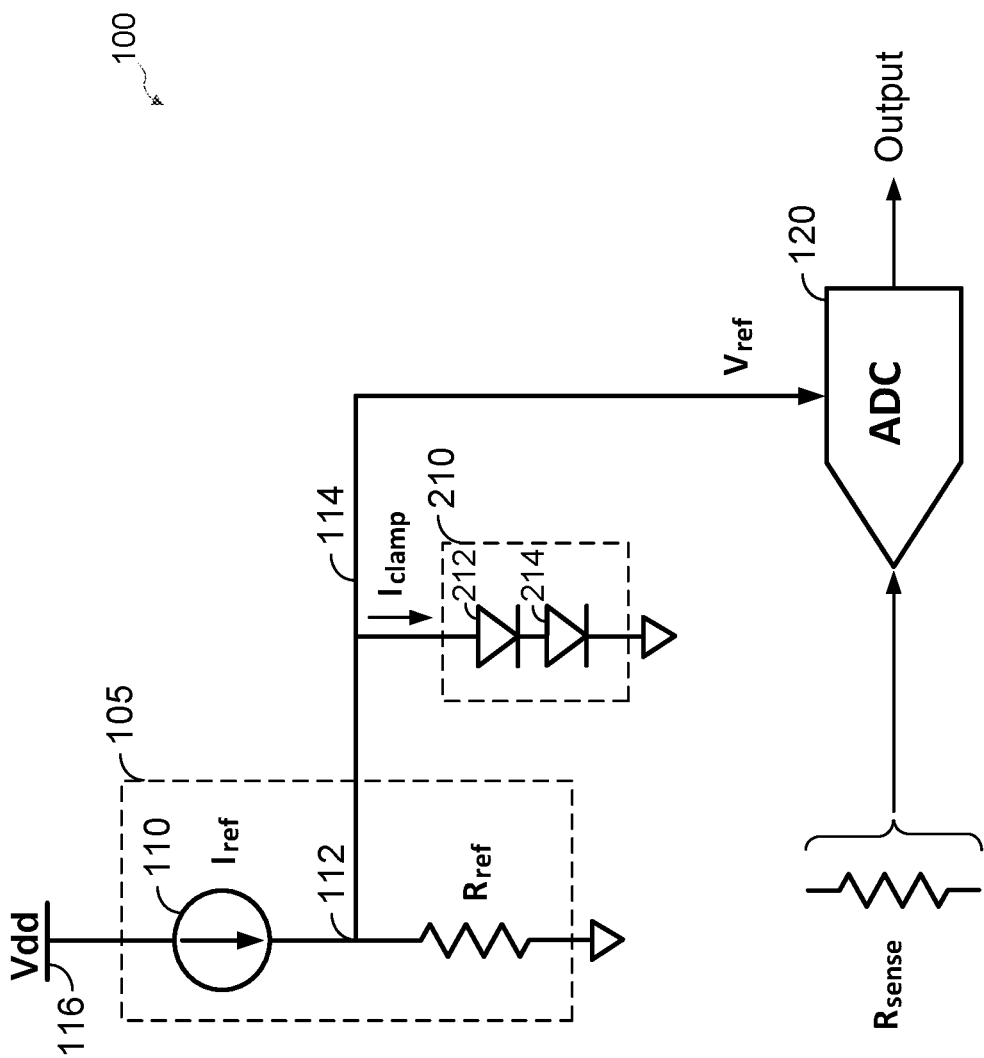
FIG. 2 shows an example of a diode-based clamp circuit between the reference circuit and the ADC according to certain aspects of the present disclosure.

FIG. 2 shows an example in which a diode-based clamp circuit 210 is coupled to the conductive line 114 between the reference circuit 105 and the ADC 120. The clamp circuit 210 is used to clamp the peak voltage on the conductive line 114. This may be done to provide over-voltage protection for the ADC 120. For example, during start-up of the reference circuit 105, the voltage on the conductive line 114 may temporarily exceed a voltage limit of the ADC 120 without the clamp circuit 210. In another example, the temperature-compensated current source 110 may be programmable. In this example, the temperature-compensated current source 110 may be incorrectly programmed to generate a reference current that results in a reference voltage $V_{ref}$ exceeding the voltage limit of the ADC 120 without the clamp circuit 210. To protect the ADC 120, the clamp circuit 210 clamps the voltage on the conductive line 114 to a clamp voltage at or below the voltage limit of the ADC 120 to prevent the voltage on the conductive line 114 from exceeding the voltage limit of the ADC 120.

In the example in FIG. 2, the diode-based clamp circuit 210 includes a first diode 212 and a second diode 214 coupled in series between the conductive line 114 and ground. The clamp voltage of the diode-based clamp circuit 210 is approximately equal to the sum of the turn-on voltages of the first diode 212 and the second diode 214.

A drawback of the diode-based clamp circuit 210 is that the diode-based clamp circuit 210 may have a relatively large leakage current when the voltage on the conductive line 114 is below the clamp voltage. The large leakage current reduces the ability of the reference voltage $V_{ref}$ to accurately track variations in the resistance of the sense resistor $R_{sense}$ across temperature, which degrades the accuracy of the current measurement output by the ADC 120, as discussed further below.

In this example, the reference voltage $V_{ref}$ is given by:

$$V_{ref} = (I_{ref} - I_{clamp}) \times R_{ref} \quad (3)$$

where $I_{clamp}$ is the leakage current of the clamp circuit 210. The current flowing through the reference resistor $R_{ref}$ is equal to the reference current minus the leakage current since a portion of the reference current flows (i.e., leaks) into the clamp circuit 210 as the leakage current. As shown in equation (3), the reference voltage $V_{ref}$ depends on the leakage current. The leakage current of the clamp circuit 210 is process and temperature dependent. As a result, the reference voltage $V_{ref}$ depends not only on variations in the resistance of the reference resistor $R_{ref}$ with temperature, but also on variations in the leakage current with temperature. This negatively impacts the ability of the reference voltage $V_{ref}$ to accurately track variations in the resistance of the sense resistor $R_{sense}$ across temperature. The larger the leakage current of the clamp circuit 210, the greater the impact on the reference voltage $V_{ref}$, and hence the greater the degradation in the accuracy of the current measurement output by the ADC 120. Accordingly, a clamp circuit with lower leakage current is desirable.

Figure 3:
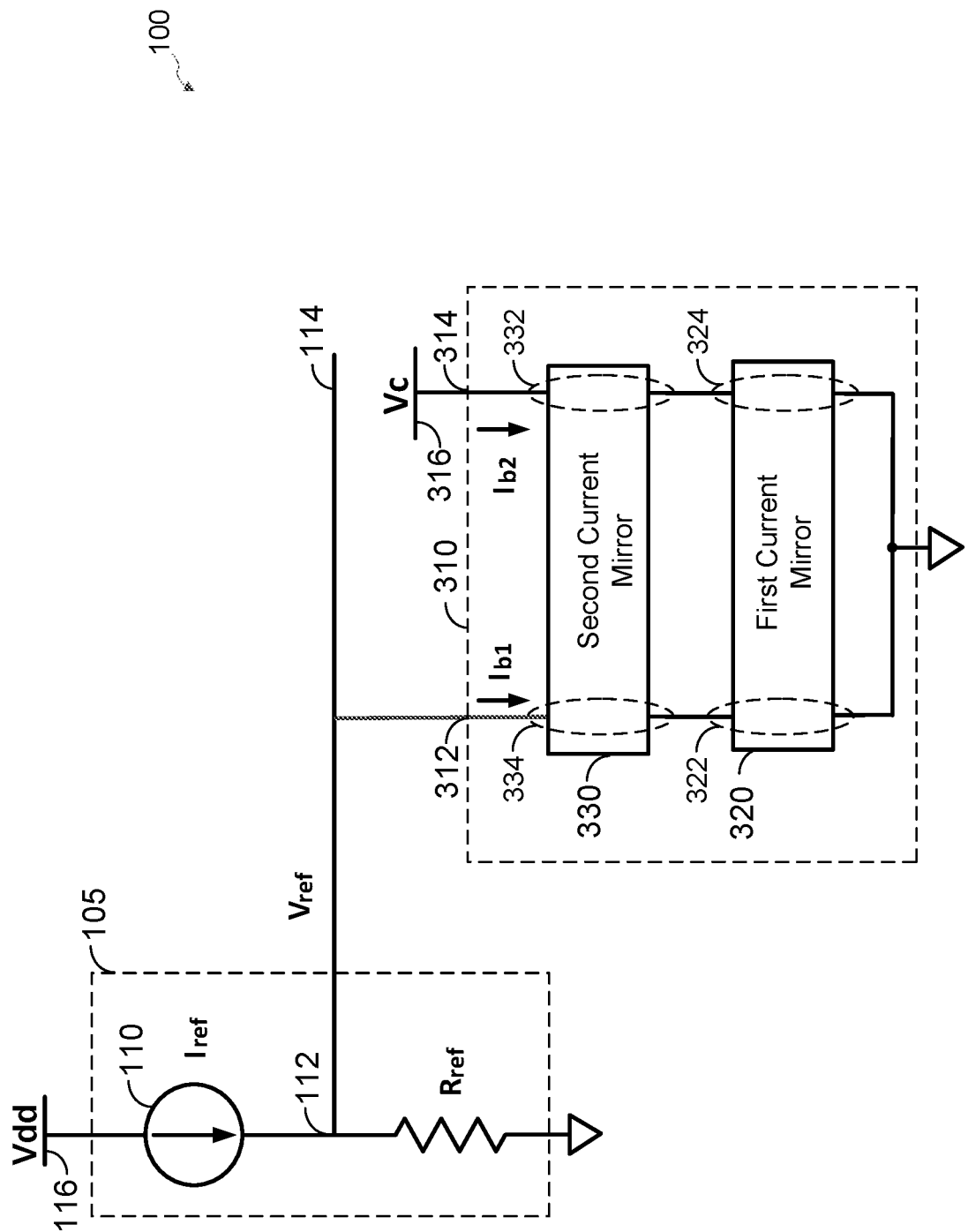
FIG. 3 shows an example of a clamp circuit according to certain aspects of the present disclosure.

FIG. 3 shows an exemplary clamp circuit 310 according to certain aspects of the present disclosure. As discussed further below, the clamp circuit 310 has a substantially lower leakage current compared with the diode-based clamp circuit 210.

The clamp circuit 310 includes a first current mirror 320 and a second current mirror 330, in which the first current mirror 320 and the second current mirror 330 are coupled into a feedback loop. The clamp circuit 310 has a first input 312 coupled to the conductive line 114, and a second input 314 coupled to a voltage line 316 (e.g., a voltage supply rail). The voltage line 316 provides a voltage (labeled "Vc") to the second input 314 of the clamp circuit 310. As discussed further below, the clamp voltage of the clamp circuit 310 is approximately equal to the voltage Vc. Thus, the clamp voltage of the clamp circuit 310 may be set to a desired clamp voltage by setting the voltage Vc to the desired clamp voltage.

In certain aspects, the voltage Vc may be a second supply voltage that is lower than the supply voltage Vdd (which may be referred to as a first supply voltage in this example). In this example, the voltage line 316 is a second supply rail providing the voltage Vc. In this example, the supply voltage Vdd may be approximately equal to 3.0 V and the voltage Vc may be a second supply voltage approximately equal to 1.8 V, although it is to be appreciated that the supply voltage Vdd and the voltage Vc may have other voltages. Also, in this example, the supply voltage Vdd may be above the voltage limit of the ADC 120 while the second supply voltage (i.e., Vc in this example) is at or below the voltage limit of the ADC 120.

In the example in FIG. 3, the first current mirror 320 has a first branch 322 and a second branch 324. The first current mirror 320 is configured to mirror the current flowing through the first branch 322 to the second branch 324. The second current mirror 330 has a first branch 332 and a second branch 334. The second current mirror 330 is configured to mirror the current flowing through the first branch 332 to the second branch 334. In this example, the first current mirror 320 and the second current mirror 330 are coupled into a feedback loop in which the first branch 322 of the first current mirror 320 is coupled in series with the second branch 334 of the second current mirror 330, and the second branch 324 of the first current mirror 320 is coupled in series with the first branch 332 of the second current mirror 330.

The first branch 332 of the second current mirror 330 is coupled to the second input 314, and the second branch 334 of the second current mirror 330 is coupled to the first input 312. Thus, the current flowing into the first input 312 (labeled "$I_{b1}$") flows through the first branch 322 of the first current mirror 320 and the second branch 334 of the second current mirror 330, and the current flowing into the second input 314 (labeled "$I_{b2}$") flows through the second branch 324 of the first current mirror 320 and the first branch 332 of the second current mirror 330.

When the voltage on the conductive line 114 is below the clamp voltage, the first current mirror 320 and the second current mirror 325 are both turned off. As a result, the leakage current into the first input 312 of the clamp circuit 310 is very low. The leakage current may be substantially lower than the leakage current of the diode-based clamp circuit 210, as discussed further below.

When the voltage on the conductive line 114 is approximately equal to the clamp voltage, the first current mirror 320 and the second current mirror 330 are both turned on. In certain aspects, the feedback loop of the clamp circuit 310 forces the currents flowing into the first input 312 and the second input 314 (i.e., $I_{b1}$ and $I_{b2}$) to be approximately the same. This clamps the voltage at the first input 312 (and hence the voltage of the conductive line 114) to approximately the voltage Vc, as discussed further below.

Figure 4:
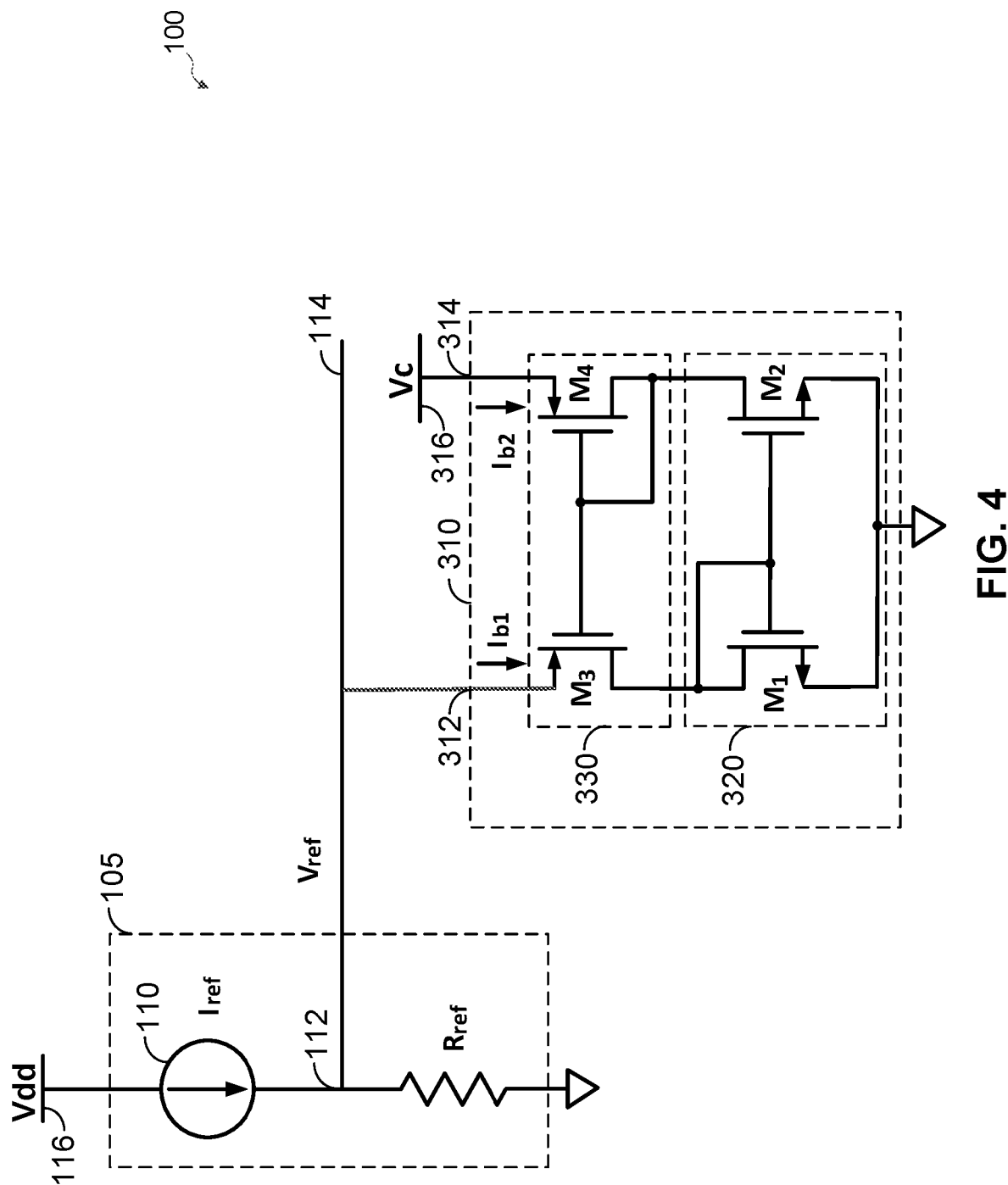
FIG. 4 shows an exemplary implementation of current mirrors in a clamp circuit according to certain aspects of the present disclosure.

FIG. 4 shows an exemplary implementation of the first current mirror 320 and the second current mirror 330 according to certain aspects. The first current mirror 320 includes a first transistor $M_1$ and a second transistor $M_2$. In the example shown in FIG. 4, each of the first transistor $M_1$ and the second transistor $M_2$ is implemented with an n-type metal oxide semiconductor (NMOS) transistor. However, it is to be appreciated that the present disclosure is not limited to this example, and that each of the first transistor $M_1$ and the second transistor $M_2$ may be implemented with a different type of transistor.

The drain of the first transistor $M_1$ is coupled to the gate of the first transistor $M_1$, and the source of the first transistor $M_1$ is coupled to ground. The gate of the second transistor $M_2$ is coupled to the gate of the first transistor $M_1$, and the source of the second transistor $M_2$ is coupled to ground. The first current mirror 320 is configured to mirror the current flowing through the first transistor $M_1$ to the second transistor $M_2$. The current flowing through the first transistor $M_1$ corresponds to the current flowing through the first branch 322 of the first current mirror 320 in FIG. 3 and the current flowing through the second transistor $M_2$ corresponds to the current flowing through the second branch 324 of the first current mirror 320 in FIG. 3.

The second current mirror 330 includes a third transistor $M_3$ and a fourth transistor $M_4$. In the example shown in FIG. 4, each of the third transistor $M_3$ and the fourth transistor $M_4$ is implemented with a p-type metal oxide semiconductor (PMOS) transistor. However, it is to be appreciated that the present disclosure is not limited to this example, and that each of the second transistor $M_3$ and the fourth transistor $M_4$ may be implemented with a different type of transistor.

The drain of the third transistor $M_3$ is coupled to the drain of the first transistor $M_1$, and the source of the third transistor $M_3$ is coupled to the first input 312 of the clamp circuit 310. The drain of the fourth transistor $M_4$ is coupled to the drain of the second transistor $M_2$ and the gate of fourth transistor $M_4$. The gate of the fourth transistor $M_4$ is coupled to the gate of the third transistor $M_3$, and the source of the fourth transistor $M_4$ is coupled to the second input 314. The second current mirror 330 is configured to mirror the current flowing through the fourth transistor $M_4$ to the third transistor $M_3$. The current flowing through the fourth transistor $M_4$ corresponds to the current flowing through the first branch 332 of the second current mirror 330 in FIG. 3 and the current flowing through the third transistor $M_3$ corresponds to the current flowing through the second branch 334 of the second current mirror 330 in FIG. 3.

When the voltage on the conductive line 114 is below the clamp voltage (which is approximately to the voltage Vc in this example), the third transistor $M_3$ and the first transistor $M_1$ are turned off. Also, the gate of the second transistor $M_2$ is pulled to ground, which turns off both the second transistor $M_2$ and the fourth transistor $M_4$. Because the transistors $M_1$ to $M_4$ in the clamp circuit 310 are turned off, the leakage current flowing into the first input 312 may be very low. The leakage current of the clamp circuit 310 may be substantially lower than the leakage current of the diode-based clamp circuit 210, as discussed further below.

When the voltage on the conductive line 114 is approximately equal to the clamp voltage (which is approximately to the voltage Vc in this example), the transistors $M_1$ to $M_4$ in the clamp circuit 310 are turned on. The feedback loop of the clamp circuit 310 forces the current flowing through the first and third transistors $M_1$ and $M_3$ and the current flowing through the second and fourth transistors $M_2$ and $M_4$ (i.e., $I_{b1}$ and $I_{b2}$) to be approximately the same. Because approximately the same current flows through the third transistor $M_3$ and the fourth transistor $M_4$, the source-to-gate voltage of the third transistor $M_3$ is approximately equal to the source-to-gate of the fourth transistor $M_4$. This causes the source voltage of the third transistor $M_3$ (which is coupled to the conductive line 114) to be approximately equal to the source voltage of the fourth transistor $M_4$, which is approximately equal to the voltage Vc. Thus, the voltage on the conductive line 114 (which is coupled to the source of the third transistor $M_3$) is clamped to approximately the voltage Vc.

In the example shown in FIG. 4, the loop gain of the clamp circuit 310 is given by the following:

$$\text{Loop Gain} = (g_{m2}/g_{m4}) \times (g_{m3}/g_{m1})/(1+g_{m3}R_{ref}) \quad (4)$$

where $g_{m1}$ is the transconductance of the first transistor $M_1$, $g_{m2}$ is the transconductance of the second transistor $M_2$, $g_{m3}$ is the transconductance of the third transistor $M_3$, $g_{m4}$ is the transconductance of the fourth transistor $M_4$, and $R_{ref}$ in equation (4) is the resistance of the reference resistor $R_{ref}$. The term $(1+g_{m3}R_{ref})$ in the loop gain is the result of the reference resistor $R_{ref}$ being coupled to the source of the third transistor $M_3$ in the example shown in FIG. 4. The feedback loop of the clamp circuit 310 is positive in this example. To ensure stability with the positive feedback, the loop gain may be made less than unity (i.e., <0 dB). This may be done, for example, by making $g_{m3}R_{ref}$ large (e.g., greater than one V/V) when the clamp circuit 310 is on.

Figure 5:
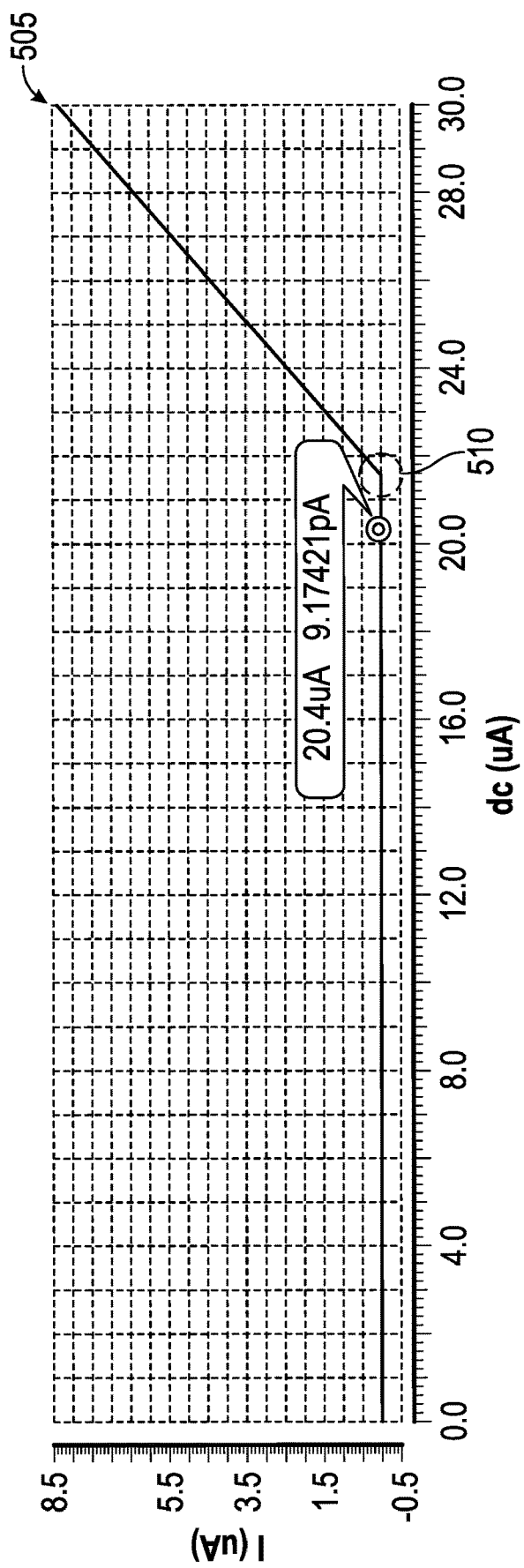
FIG. 5 is a plot showing an example of simulation results for a clamp circuit according to certain aspects of the present disclosure.

FIG. 5 is a plot 505 showing an example of simulation results for the clamp circuit 310 according to aspects of the present disclosure. The horizontal axis of the plot 505 shows the reference current of the current source 110, and the vertical axis of the plot shows the current flowing into the clamp circuit 310 from the conductive line 114. The current flowing into the clamp circuit 310 is very low when the reference voltage $V_{ref}$ is below the clamp voltage corresponding to very low leakage current. When the reference voltage $V_{ref}$ rises above the clamp circuit 310, the clamp circuit 310 turns on and the current flowing into the clamp circuit 310 increases with increases in the reference current to clamp the conductive line 114 at the clamp voltage. As shown in FIG. 5, the transition 510 from non-clamped current to clamped current for the clamp circuit 310 is sharp.

Figure 6:
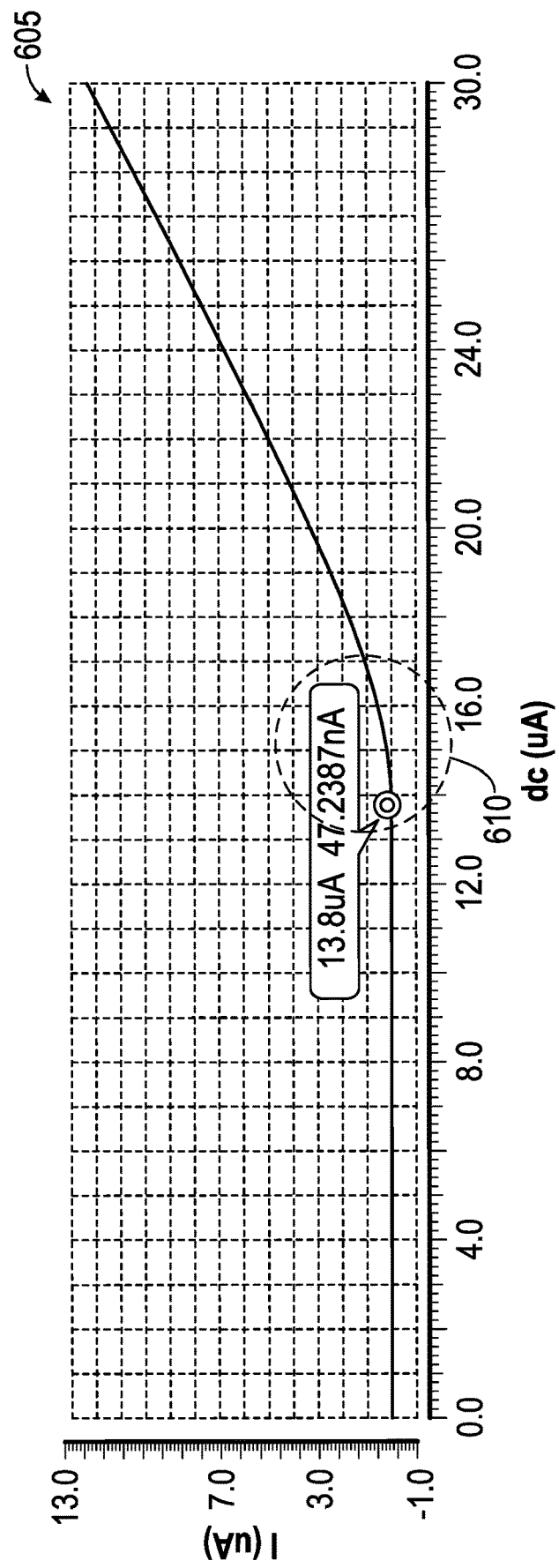
FIG. 6 is a plot showing an example of simulation results for a diode-based clamp circuit according to certain aspects of the present disclosure.

FIG. 6 is a plot 605 showing an example of simulation results for the diode-based clamp circuit 210. The horizontal axis of the plot 605 shows the reference current of the current source 110, and the vertical axis of the plot 605 shows the current flowing into the diode-based clamp circuit 210 from the conductive line 114. As shown in FIG. 6, the transition 610 from non-clamped current to clamped current for the diode-based clamp circuit 210 is gradual compared to the sharp transition 510 for the clamp circuit 310. The gradual transition for the diode-based clamp circuit 210 is indicative of a larger leakage current.

FIG. 5 shows an example in which the clamp circuit 310 has a very low leakage current of 9.17421 pA below the clamp voltage. In contrast, FIG. 6 shows an example in which the diode-based clamp circuit 210 has a leakage current of 47.2387 nA below the clamp voltage, which is several orders of magnitude greater than the leakage current for the clamp circuit 310. Thus, the clamp circuit 310 has a substantially lower leakage current compared with the diode-based clamp circuit 210.

Also, the clamp voltage of the clamp circuit 310, which is set by the voltage Vc, is approximately independent of process and temperature variations. In contrast, the clamp voltage of the diode-based clamp circuit 210 is strongly dependent on process and temperature variations. This is because the clamp voltage of the diode-based clamp circuit 210 is set by the turn-on voltages of the diodes 212 and 214, which are a strong function of both process and temperature.

Figure 7:
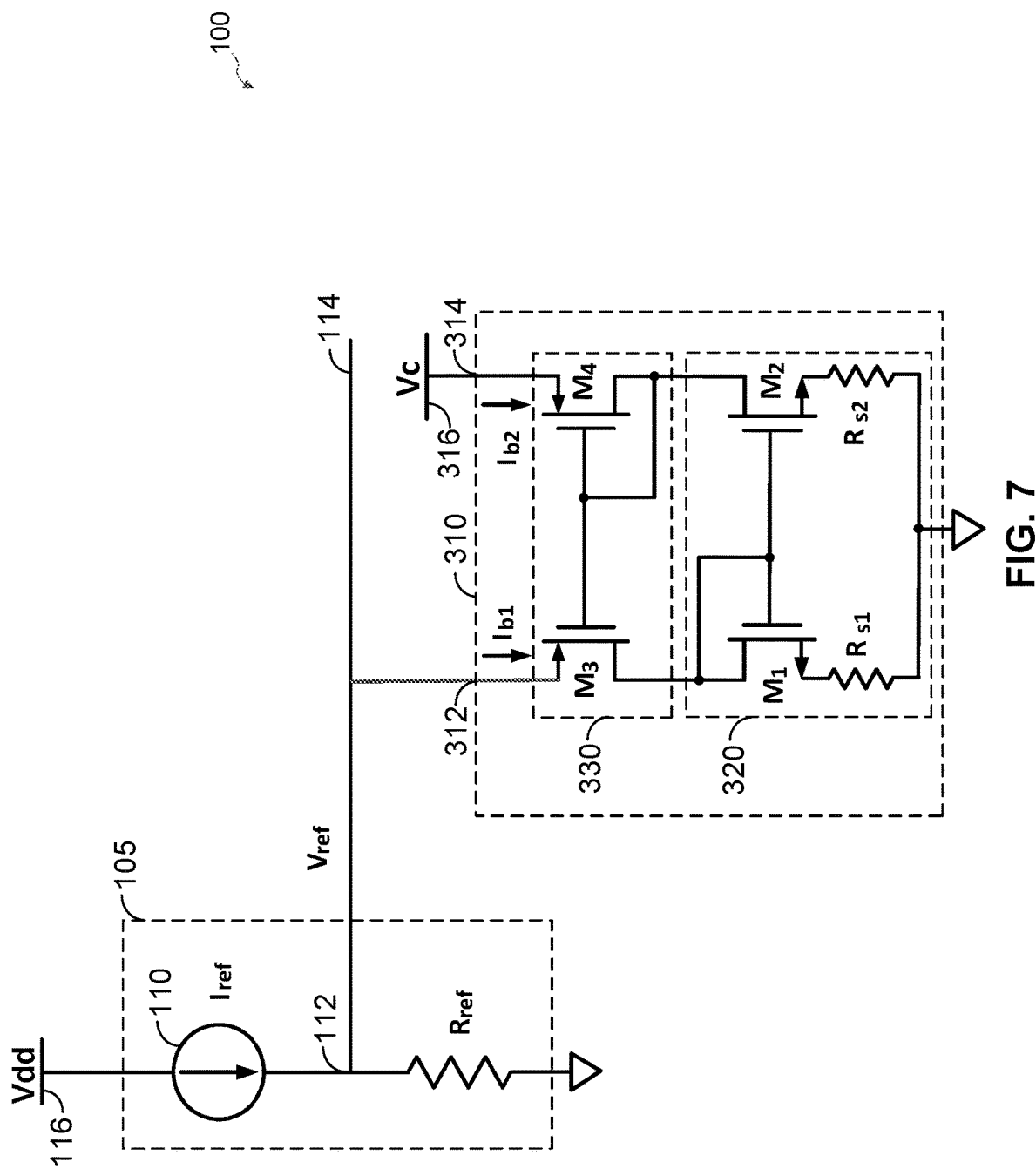
FIG. 7 shows another exemplary implementation of current mirrors in a clamp circuit according to certain aspects of the present disclosure.

It is to be appreciated that the first current mirror 320 and the second current mirror 330 are not limited to the exemplary implementation shown in FIG. 4. For example, FIG. 7 shows an example in which the first current mirror 320 further includes a first source resistor $R_{s1}$ between the source of the first transistor $M_1$ and ground, and a second source resistor $R_{s2}$ between the source of the second transistor $M_2$ and ground. In this example, the source of the first transistor $M_1$ is coupled to ground via the first source resistor $R_{s1}$, and the source of the second transistor $M_2$ is coupled to ground via the second source resistor $R_{s2}$. In other examples, the first current mirror 320 and/or the second current mirror 340 may each be implemented with a cascode current mirror, a Wilson current mirror, or another type of current mirror.

Figure 8A:
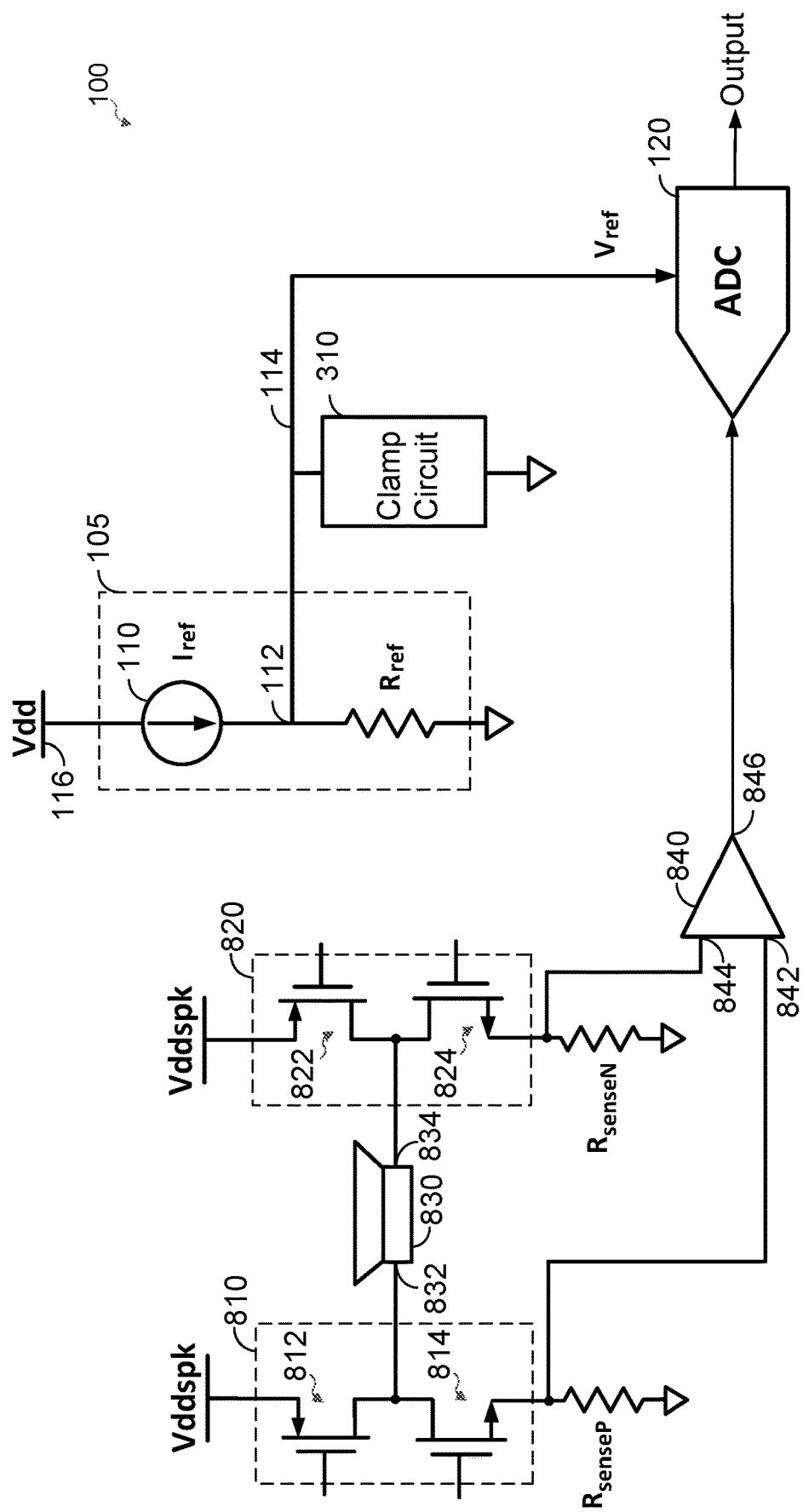
FIG. 8A shows an example in which a clamp circuit is used in a speaker protection circuit according to certain aspects of the present disclosure.

FIG. 8A shows an example in which the clamp circuit 310 is used in a speaker protection circuit configured to protect a speaker 830 from overheating. Note that only a portion of the speaker protection circuit is shown in FIG. 8A. In this example, the speaker 830 may be driven by a first driver circuit 810 and a second driver circuit 820 where the first driver circuit 810 is coupled to a first end 832 of the speaker 830 and the second driver circuit 820 is coupled to a second end 834 of the speaker 830. The first driver circuit 810 includes transistors 812 and 814, and the second driver circuit 820 includes transistors 822 and 824.

In this example, the speaker protection circuit includes a first sense resistor $R_{senseP}$ coupled between the first driver circuit 810 and ground, and a second sense resistor $R_{senseN}$ coupled between the second driver circuit 820 and ground. The sense resistors $R_{senseP}$ and $R_{senseN}$ are used to measure the current flowing through the speaker 830, as discussed further below.

To drive current from the first end 832 to the second end 834 of the speaker 830, transistors 812 and 824 are turned on and transistors 814 and 822 are turned off. In this case, the speaker current flows through the second sense resistor $R_{senseN}$, generating a sense voltage across the second sense resistor $R_{senseN}$ that may be used to measure the speaker current. To drive current from the second end 834 to the first end 832 of the speaker 830, transistors 822 and 814 are turned on and transistors 812 and 824 are turned off. In this case, the speaker current flows through the first sense resistor $R_{senseP}$, generating a sense voltage across the first sense resistor $R_{senseP}$ that may be used to measure the speaker current.

The speaker protection circuit also includes a combiner 840 configured to combine the sense voltages of the sense resistors $R_{senseN}$ and $R_{senseP}$ into a combined voltage, and input the combined voltage to the ADC 120, which converts the combined voltage into a digital current measurement. In the example in FIG. 8A, the combiner 840 has a first input 842 coupled between the first sense resistor $R_{senseP}$ and the first driver circuit 810, a second input 844 coupled between the second sense resistor $R_{senseN}$ and the second driver circuit 820, and an output 846 coupled to the analog input of the ADC 120.

The speaker protection circuit also measures the voltage across the speaker. Note that the portion of the speaker protection circuit that measures the voltage is not shown in FIG. 8A. The speaker protection circuit uses the measured voltage across the speaker 830 and the measured current of the speaker 830 obtained from the sense resistors $R_{senseP}$ and $R_{senseN}$ to determine the impedance of the speaker 830. Since the impedance of the speaker is dependent on the temperature of the speaker 830, the speaker protection circuit uses the impedance measurement of the speaker 830 (i.e., determined impedance) to measure the temperature of the speaker 830. If the measured temperature exceeds a safe operating temperature for the speaker 830, then the speaker protection circuit may reduce the volume of the speaker 830 to reduce the temperature.

The resistance of each sense resistor $R_{senseP}$ and $R_{senseN}$ is dependent on the temperature of the sense resistor. As a result, the current measurement of the speaker 830 obtained from the sense resistors $R_{senseP}$ and $R_{senseN}$ varies with the temperature of the sense resistors, which negatively affects accuracy of the current measurement. To address this, the reference circuit 105 generates the reference voltage $V_{ref}$, which tracks variations in the resistances of the sense resistors $R_{senseP}$ and $R_{senseN}$ with temperature in the manner discussed above. The reference voltage $V_{ref}$ is input to the ADC 120. Since the reference voltage $V_{ref}$ tracks variations in the resistances of the sense resistors $R_{senseP}$ and $R_{senseN}$ with temperature, the reference voltage $V_{ref}$ allows the ADC 120 to provide a consistent digital current measurement for a given speaker current across temperature.

In this example, the clamp circuit 310 provides over-voltage protection for the ADC 120, as discussed above. The low leakage current of the clamp circuit 310 allows the reference voltage $V_{ref}$ to accurately track variations in the resistances of the sense resistors $R_{senseP}$ and $R_{senseN}$ across temperature.

Figure 8B:
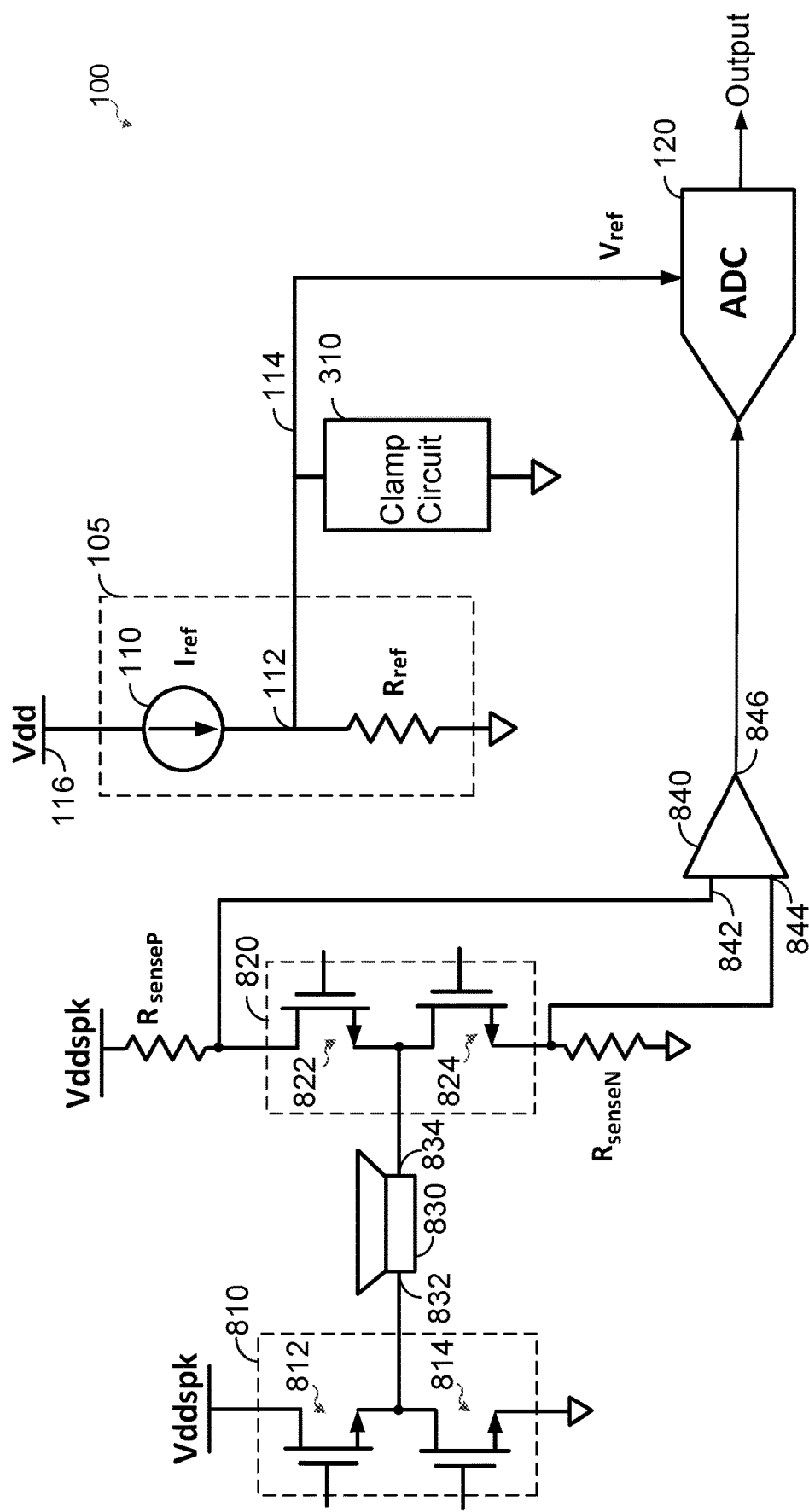
FIG. 8B shows another example in which a clamp circuit is used in a speaker protection circuit according to certain aspects of the present disclosure.

FIG. 8B shows another example of the speaker protection circuit in which the first sense resistor $R_{senseP}$ is coupled between the second driver 820 and the voltage supply rail Vddspk, and the first input 842 of the combiner 840 is coupled between the first sense resistor $R_{senseP}$ and the second driver 820.

Figure 9:
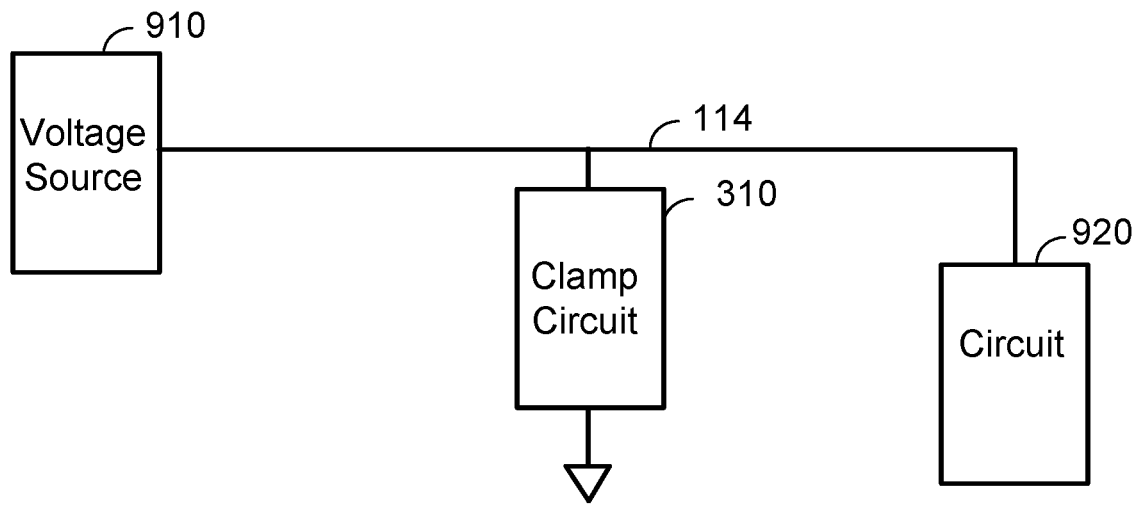
FIG. 9 shows an example of a clamp circuit between a voltage source and a circuit according to certain aspects of the present disclosure.

It is to be appreciated that the clamp circuit 310 is not limited to the example of speaker protection discussed above, and that the clamp circuit 310 may be used in other applications in which voltage clamping and low leakage current are desirable. In this regard, FIG. 9 shows an example in which the conductive line 114 is coupled between a voltage source 910 and a circuit 920. The circuit 920 receives a supply voltage from the voltage source 910 via the conductive line 114. In this example, the clamp circuit 310 is coupled to the conductive line 114 to provide over-voltage protection for the circuit 920. The voltage source 910 may include a switching voltage regulator, a linear voltage regulator, a power management integrated circuit (PMIC), etc. The circuit 920 may include a processor, a modem, logic, etc. In this example, the clamp voltage of the clamp circuit 310 may be set to a voltage at or below a voltage limit of the circuit 920 to protect the circuit 920, for example, from a voltage spike on the conductive line 114 and/or another event causing the voltage on the conductive line 114 to exceed the voltage limit of the circuit 920.

Figure 10:
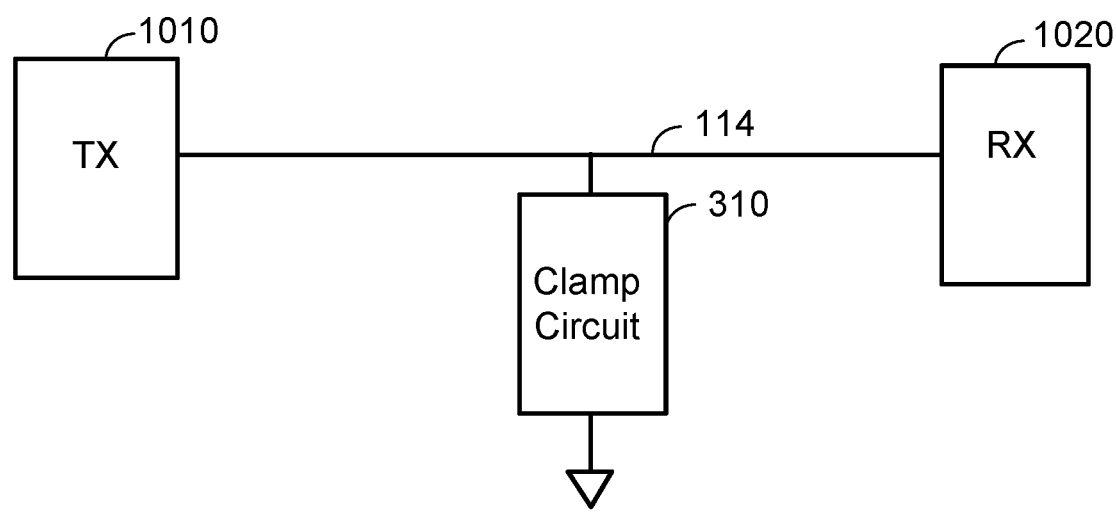
FIG. 10 shows an example of a clamp circuit between a transmitter and a receiver according to certain aspects of the present disclosure.

FIG. 10 shows an example in which the conductive line 114 is coupled between a transmitter 1010 and a receiver 1020. In this example, the receiver 1020 receives a signal (e.g., data signal, control signal, etc.) from the transmitter 1010 via the conductive line 114. In this example, the clamp circuit 310 is coupled to the conductive line 114 to provide over-voltage protection for the receiver 1020. The transmitter 1010 may include a driver configured to drive the conductive line 114 with the signal, and the receiver 1020 may include an amplifier configured to receive the signal, an equalizer, a slicer, etc. In this example, the conductive line 114 may include one or more metal traces, a cable, one or more wires, or any combination thereof.

Figure 11:
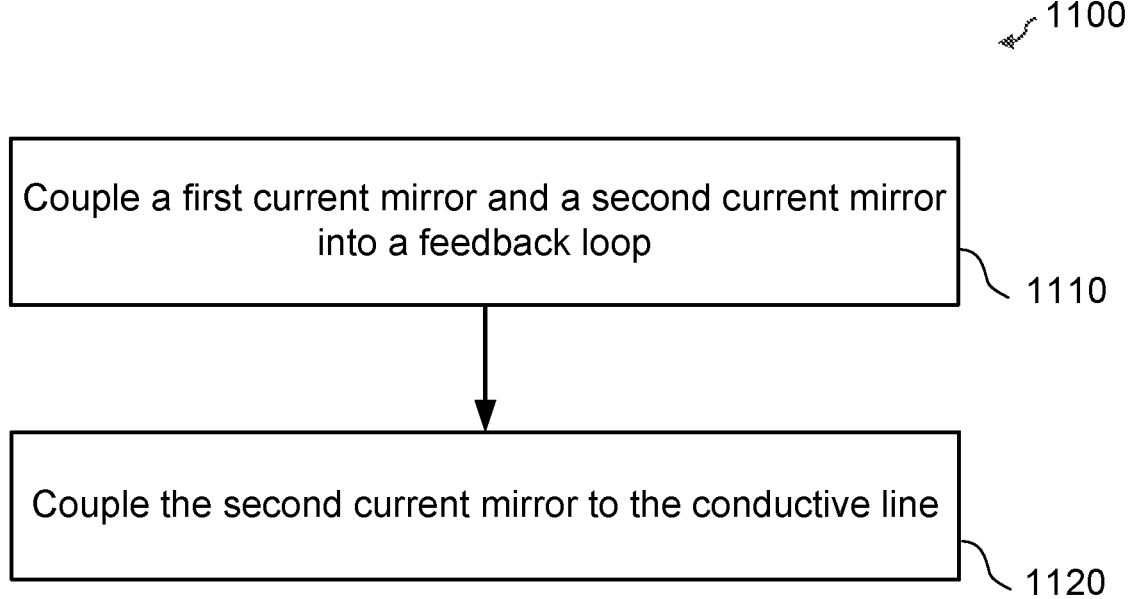
FIG. 11 is a flowchart illustrating a method for clamping a voltage on a conductive line according to certain aspects of the present disclosure.

FIG. 11 illustrates a method 1100 for clamping a voltage on a conductive line according to certain aspects of the present disclosure.

At block 1110, a first current mirror and a second current mirror are coupled into a feedback loop. For example, the first current mirror (e.g., first current mirror 320) may have a first branch 322 and a second branch 324, wherein the first current mirror is configured to mirror a current flowing through the first branch of the first current mirror to the second branch of the first current mirror, and, the second current mirror (e.g., second current mirror 330) may have a first branch (e.g., first branch 332) and a second branch (e.g., second branch 334), wherein the second current mirror is configured to mirror a current flowing through the first branch of the second current mirror to the second branch of the second current mirror. In this example, the first current mirror and the second current mirror may be coupled into the feedback loop by coupling the first branch of the first current mirror in series with the second branch of the second current mirror, and coupling the second branch of the first current mirror in series with the first branch of the second current mirror.

At block 1120, the second current mirror is coupled to the conductive line. For example, the second branch of the second current mirror may be coupled to the conductive line (e.g., conductive line 114). In this example, the first branch of the second current mirror may be coupled to a voltage line, in which the feedback loop clamps the voltage on the conductive line to approximately a voltage (e.g., clamp voltage Vc) on the voltage line.

In certain aspects, the conductive line may be coupled between a reference circuit (e.g., reference circuit 105) configured to generate a reference voltage (e.g., $V_{ref}$) and an analog-to-digital converter (ADC) (e.g., ADC 120). In certain aspects, the conductive line may be coupled between a voltage source (e.g., voltage source 910) and a circuit (e.g., circuit 920). In certain aspects, the conductive line may be coupled between a transmitter (e.g., transmitter 1010) and a receiver (e.g., receiver 1020).

Implementation examples are described in the following numbered clauses:

1. A clamp circuit, comprising:
   a first current mirror having a first branch and a second branch, wherein the first current mirror is configured to mirror a current flowing through the first branch of the first current mirror to the second branch of the first current mirror; and
   a second current mirror having a first branch and a second branch, wherein the second current mirror is configured to mirror a current flowing through the first branch of the second current mirror to the second branch of the second current mirror;
   wherein the first branch of the first current mirror is coupled in series with the second branch of the second current mirror, and the second branch of the first current mirror is coupled in series with the first branch of the second current mirror.

2. The clamp circuit of clause 1, wherein clamp circuit is coupled to a conductive line, and the clamp circuit is configured to clamp a voltage of the conductive line to a clamp voltage.

3. The clamp circuit of clause 2, wherein the second branch of the second current mirror is coupled to the conductive line, the first branch of the second current mirror is coupled to a voltage line, and the clamp voltage is approximately equal to a voltage on the voltage line.

4. The clamp circuit of any one of clauses 1 to 3, wherein the first current mirror comprises:
   a first transistor having a drain, a gate, and a source, wherein the drain of the first transistor is coupled to the gate of the first transistor, and the source of the first transistor is coupled to a ground; and
   a second transistor having a drain, a gate, and a source, wherein the gate of the second transistor is coupled to the gate of the first transistor, and the source of the second transistor is coupled to the ground.

5. The clamp circuit of clause 4, wherein each of the first transistor and the second transistor comprises an n-type metal oxide semiconductor (NMOS) transistor.

6. The clamp circuit of clause 4 or 5, wherein the first current mirror further comprises:
   a first source resistor between the source of the first transistor and the ground; and
   a second source resistor between the source of the second transistor and the ground.

7. The clamp circuit of any one of clauses 4 to 6, wherein the second current mirror comprises:
   a third transistor having a drain, a gate, and a source, wherein the drain of the third transistor is coupled to the drain of the first transistor; and
   a fourth transistor having a drain, a gate, and a source, wherein the drain of the fourth transistor is coupled to the drain of the second transistor and the gate of the fourth transistor, and the gate of the fourth transistor is coupled to the gate of the third transistor.

8. The clamp circuit of clause 7, wherein each of the third transistor and the fourth transistor comprises a p-type metal oxide semiconductor (PMOS) transistor.

9. The clamp circuit of clause 7, wherein each of the first transistor and the second transistor comprises an n-type metal oxide semiconductor (NMOS) transistor, and each of the third transistor and the fourth transistor comprises a p-type metal oxide semiconductor (PMOS) transistor.

10. The clamp circuit of any one of clauses 7 to 9, wherein the source of the third transistor is coupled to a conductive line, and the source of the fourth transistor is coupled to a voltage line.

11. The clamp circuit of any one of clauses 3 to 9, wherein the clamp circuit is coupled to a conductive line, and the conductive line is coupled to a reference circuit configured to generate a reference voltage.

12. The clamp circuit of clause 12, wherein the conductive line is coupled between the reference circuit and an analog-to-digital converter.

13. The clamp circuit of any one of clauses 3 to 9, wherein the clamp circuit is coupled to a conductive line, and the conductive line is coupled between a voltage source and a circuit.

14. The clamp circuit of any one of clauses 3 to 9, wherein the clamp circuit is coupled to a conductive line, and the conductive line is coupled between a transmitter and a receiver.

15. A system, comprising:
   a reference circuit configured to generate a reference voltage;
   an analog-to-digital converter (ADC);
   a conductive line coupled between the reference circuit and the ADC; and
   a clamp circuit coupled to the conductive line, the clamp circuit comprising:
   a first current mirror having a first branch and a second branch, wherein the first current mirror is configured to mirror a current flowing through the first branch of the first current mirror to the second branch of the first current mirror; and
   a second current mirror having a first branch and a second branch, wherein the second current mirror is configured to mirror a current flowing through the first branch of the second current mirror to the second branch of the second current mirror;
   wherein the first branch of the first current mirror is coupled in series with the second branch of the second current mirror, and the second branch of the first current mirror is coupled in series with the first branch of the second current mirror.

16. The system of clause 15, wherein the reference circuit comprises:
   a current source; and a reference resistor, wherein the current source and the reference resistor are coupled in series between a first supply rail and a ground, and the conductive line is coupled between the current source and the reference resistor.

17. The system of clause 15 or 16, wherein the first current mirror comprises:
a first transistor having a drain, a gate, and a source, wherein the drain of the first transistor is coupled to the gate of the first transistor, and the source of the first transistor is coupled to a ground; and
a second transistor having a drain, a gate, and a source, wherein the gate of the second transistor is coupled to the gate of the first transistor, and the source of the second transistor is coupled to the ground.

18. The system of clause 17, wherein each of the first transistor and the second transistor comprises an n-type metal oxide semiconductor (NMOS) transistor.

19. The system of clause 17 or 18, wherein the first current mirror further comprises:
a first source resistor between the source of the first transistor and the ground; and
a second source resistor between the source of the second transistor and the ground.

20. The system of any one of clauses 17 to 19, wherein the second current mirror comprises:
a third transistor having a drain, a gate, and a source, wherein the drain of the third transistor is coupled to the drain of the first transistor; and
a fourth transistor having a drain, a gate, and a source, wherein the drain of the fourth transistor is coupled to the drain of the second transistor and the gate of the fourth transistor, and the gate of the fourth transistor is coupled to the gate of the third transistor.

21. The system of clause 20, wherein each of the third transistor and the fourth transistor comprises a p-type metal oxide semiconductor (PMOS) transistor.

22. The system of clause 20, wherein each of the first transistor and the second transistor comprises an n-type metal oxide semiconductor (NMOS) transistor, and each of the third transistor and the fourth transistor comprises a p-type metal oxide semiconductor (PMOS) transistor.

23. The system of any one of clauses 20 to 22, wherein the source of the third transistor is coupled to the conductive line, and the source of the fourth transistor is coupled to a voltage line.

24. The system of clause 23, wherein the reference circuit comprises:
a current source; and
a reference resistor, wherein the current source and the reference resistor are coupled in series between a first supply rail and a ground, and the conductive line is coupled between the current source and the reference resistor;
wherein the voltage line comprises a second supply rail, the first supply rail provides a first supply voltage, the second supply rail provides a second supply voltage, and the second supply voltage is lower than the first supply voltage.

25. A clamp circuit, comprising:
a first transistor having a drain, a gate, and a source, wherein the drain of the first transistor is coupled to the gate of the first transistor, and the source of the first transistor is coupled to a ground;
a second transistor having a drain, a gate, and a source, wherein the gate of the second transistor is coupled to the gate of the first transistor, and the source of the second transistor is coupled to the ground;
a third transistor having a drain, a gate, and a source, wherein the drain of the third transistor is coupled to the drain of the first transistor; and
a fourth transistor having a drain, a gate, and a source, wherein the drain of the fourth transistor is coupled to the drain of the second transistor and the gate of the fourth transistor, and the gate of the fourth transistor is coupled to the gate of the third transistor.

26. The clamp circuit of clause 25, wherein each of the first transistor and the second transistor comprises an n-type metal oxide semiconductor (NMOS) transistor, and each of the third transistor and the fourth transistor comprises a p-type metal oxide semiconductor (PMOS) transistor.

27. The clamp circuit of clause 26, wherein the source of the third transistor is coupled to a conductive line, and the source of the fourth transistor is coupled to a voltage line.

28. A method for clamping a voltage on a conductive line, comprising:
coupling a first current mirror and a second current mirror into a feedback loop; and
coupling the second current mirror to the conductive line.

29. The method of clause 28, further comprising coupling the second current mirror to a voltage line.

30. The method of clause 29, wherein:
coupling the second current mirror to the voltage line comprises coupling a first branch of the second current mirror to the voltage line; and
coupling the second current mirror to the conductive line comprises coupling a second branch of the second current mirror to the conductive line.

31. The method of any one of clauses 28 to 30, wherein the conductive line is coupled between a reference circuit configured to generate a reference voltage and an analog-to-digital converter (ADC).

It is to be appreciated that the present disclosure is not limited to the exemplary terms used above to describe aspects of the present disclosure, and that the present disclosure covers equivalent terms. For example, it is to be appreciated that a clamp circuit may also be referred to as a clamp, a clamp device, a clamping circuit, a clamping device, a voltage limiter, or another term. In another example, it is to be appreciated that a voltage line may also be referred to as a voltage rail, or another term.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures. As used herein, the term "approximately" means within 10 percent of the stated value (e.g., between 90 percent and 110 percent of the stated value).

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A clamp circuit, comprising:
   a first current mirror having a first branch and a second branch, wherein the first current mirror is configured to mirror a current flowing through the first branch of the first current mirror to the second branch of the first current mirror; and
   a second current mirror having a first branch and a second branch, wherein the second current mirror is configured to mirror a current flowing through the first branch of the second current mirror to the second branch of the second current mirror;
   wherein the first branch of the first current mirror and the second branch of the second current mirror are coupled in series between a conductive line and a ground, and the second branch of the first current mirror and the first branch of the second current mirror are coupled in series between a voltage line and the ground.

2. The clamp circuit of claim 1, wherein the clamp circuit is configured to clamp a voltage of the conductive line to a clamp voltage.

3. The clamp circuit of claim 2, wherein the clamp voltage is approximately equal to a voltage on the voltage line.

4. The clamp circuit of claim 1, wherein the first current mirror comprises:
   a first transistor having a drain, a gate, and a source, wherein the drain of the first transistor is coupled to the gate of the first transistor, and the source of the first transistor is coupled to a ground; and
   a second transistor having a drain, a gate, and a source, wherein the gate of the second transistor is coupled to the gate of the first transistor, and the source of the second transistor is coupled to the ground.

5. The clamp circuit of claim 4, wherein each of the first transistor and the second transistor comprises an n-type metal oxide semiconductor (NMOS) transistor.

6. The clamp circuit of claim 4, wherein the first current mirror further comprises:
   a first source resistor between the source of the first transistor and the ground; and
   a second source resistor between the source of the second transistor and the ground.

7. The clamp circuit of claim 4, wherein the second current mirror comprises:
   a third transistor having a drain, a gate, and a source, wherein the drain of the third transistor is coupled to the drain of the first transistor; and
   a fourth transistor having a drain, a gate, and a source, wherein the drain of the fourth transistor is coupled to the drain of the second transistor and the gate of the fourth transistor, and the gate of the fourth transistor is coupled to the gate of the third transistor.

8. The clamp circuit of claim 7, wherein each of the third transistor and the fourth transistor comprises a p-type metal oxide semiconductor (PMOS) transistor.

9. The clamp circuit of claim 7, wherein each of the first transistor and the second transistor comprises an n-type metal oxide semiconductor (NMOS) transistor, and each of the third transistor and the fourth transistor comprises a p-type metal oxide semiconductor (PMOS) transistor.

10. The clamp circuit of claim 7, wherein the source of the third transistor is coupled to the conductive line, and the source of the fourth transistor is coupled to the voltage line.

11. The clamp circuit of claim 1, wherein the conductive line is coupled to a reference circuit configured to generate a reference voltage.

12. The clamp circuit of claim 11, wherein the conductive line is coupled between the reference circuit and an analog-to-digital converter.

13. The clamp circuit of claim 1, wherein the conductive line is coupled between a voltage source and a circuit.

14. The clamp circuit of claim 1, wherein the conductive line is coupled between a transmitter and a receiver.

15. A system, comprising:
   a reference circuit configured to generate a reference voltage;
   an analog-to-digital converter (ADC);
   a conductive line coupled between the reference circuit and the ADC; and
   a clamp circuit coupled to the conductive line, the clamp circuit comprising:
      a first current mirror having a first branch and a second branch, wherein the first current mirror is configured to mirror a current flowing through the first branch of the first current mirror to the second branch of the first current mirror; and
      a second current mirror having a first branch and a second branch, wherein the second current mirror is configured to mirror a current flowing through the first branch of the second current mirror to the second branch of the second current mirror;
      wherein the first branch of the first current mirror is coupled in series with the second branch of the second current mirror, and the second branch of the first current mirror is coupled in series with the first branch of the second current mirror; and
      wherein the first current mirror comprises:
         a first transistor having a drain, a gate, and a source, wherein the drain of the first transistor is coupled to the gate of the first transistor, and the source of the first transistor is coupled to a ground; and
         a second transistor having a drain, a gate, and a source, wherein the gate of the second transistor is coupled to the gate of the first transistor, and the source of the second transistor is coupled to the ground.

16. The system of claim 15, wherein the reference circuit comprises:
   a current source; and
   a reference resistor, wherein the current source and the reference resistor are coupled in series between a first supply rail and a ground, and the conductive line is coupled between the current source and the reference resistor.

17. The system of claim 15, wherein each of the first transistor and the second transistor comprises an n-type metal oxide semiconductor (NMOS) transistor.

18. The system of claim 15, wherein the first current mirror further comprises:
   a first source resistor between the source of the first transistor and the ground; and
   a second source resistor between the source of the second transistor and the ground.

19. The system of claim 15, wherein the second current mirror comprises:

a third transistor having a drain, a gate, and a source, wherein the drain of the third transistor is coupled to the drain of the first transistor; and a fourth transistor having a drain, a gate, and a source, wherein the drain of the fourth transistor is coupled to the drain of the second transistor and the gate of the fourth transistor, and the gate of the fourth transistor is coupled to the gate of the third transistor.

20. The system of claim 19, wherein each of the third transistor and the fourth transistor comprises a p-type metal oxide semiconductor (PMOS) transistor.

21. The system of claim 19, wherein each of the first transistor and the second transistor comprises an n-type metal oxide semiconductor (NMOS) transistor, and each of the third transistor and the fourth transistor comprises a p-type metal oxide semiconductor (PMOS) transistor.

22. The system of claim 19, wherein the source of the third transistor is coupled to the conductive line, and the source of the fourth transistor is coupled to a voltage line.

23. The system of claim 22, wherein the reference circuit comprises:

a current source; and a reference resistor, wherein the current source and the reference resistor are coupled in series between a first supply rail and a ground, and the conductive line is coupled between the current source and the reference resistor;

wherein the voltage line comprises a second supply rail, the first supply rail provides a first supply voltage, the second supply rail provides a second supply voltage, and the second supply voltage is lower than the first supply voltage.

24. A clamp circuit, comprising:

a first transistor having a drain, a gate, and a source, wherein the drain of the first transistor is coupled to the gate of the first transistor, and the source of the first transistor is coupled to a ground;

a second transistor having a drain, a gate, and a source, wherein the gate of the second transistor is coupled to the gate of the first transistor, and the source of the second transistor is coupled to the ground;

a third transistor having a drain, a gate, and a source, wherein the drain of the third transistor is coupled to the drain of the first transistor, and the source of the third transistor is coupled to a conductive line; and a fourth transistor having a drain, a gate, and a source, wherein the drain of the fourth transistor is coupled to the drain of the second transistor and the gate of the fourth transistor, the source of the fourth transistor is coupled to a voltage line, and the gate of the fourth transistor is coupled to the gate of the third transistor.

25. The clamp circuit of claim 24, wherein each of the first transistor and the second transistor comprises an n-type metal oxide semiconductor (NMOS) transistor, and each of the third transistor and the fourth transistor comprises a p-type metal oxide semiconductor (PMOS) transistor.

26. The clamp circuit of claim 24, wherein the conductive line is coupled between a reference circuit and an analog-to-digital converter.

27. The clamp circuit of claim 24, wherein the conductive line is coupled between a voltage source and a circuit.

28. The clamp circuit of claim 24, wherein the conductive line is coupled between a transmitter and a receiver.

29. A method for clamping a voltage on a conductive line, comprising:

coupling a first current mirror and a second current mirror into a feedback loop;

coupling a first branch of the second current mirror to a voltage line;

coupling a second branch of the second current mirror to the conductive line;

coupling a first branch of the first current mirror to a ground; and coupling a second branch of the first current mirror to the ground.

30. The method of claim 29, wherein coupling the first current mirror and the second current mirror into the feedback loop comprises:

coupling the first branch of the first current mirror in series with the second branch of the second current mirror; and coupling the second branch of the first current mirror in series with the first branch of the second current mirror.

\* \* \* \* \*